US012693322B1

(12) United States Patent
Tsironis

(10) Patent No.: US 12,693,322 B1
(45) Date of Patent: Jul. 28, 2026

(54) UNIVERSAL TUNER FOR ON WAFER LOAD PULL

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 206 days.

(21) Appl. No.: 18/510,805

(22) Filed: Dec. 4, 2023

(51) Int. Cl.
*G01R 29/08* (2006.01)

(52) U.S. Cl.
CPC ................................ *G01R 29/0878* (2013.01)

(58) Field of Classification Search
CPC  G01R 29/0878; G01R 1/203; G01R 31/2822; G01R 31/2612; G01R 35/005; G01R 27/04; G01R 31/2601; G01R 27/32; H01P 1/212; H01P 5/04; H01P 3/023; H03H 7/40; H03H 7/38; H03J 7/00; H03J 3/00
See application file for complete search history.

(56) References Cited

U.S. PATENT DOCUMENTS

| | | | |
|---|---|---|---|
| 7,102,457 B1 * | 9/2006 | Tsironis | ............. G01R 31/2893 333/263 |
| 9,335,345 B1 | 5/2016 | Tsironis | |
| 9,431,999 B1 * | 8/2016 | Tsironis | .................... H03J 1/06 |
| 9,653,332 B1 | 5/2017 | Tsironis | |
| 10,686,239 B1 | 6/2020 | Tsironis | |
| 11,506,708 B1 * | 11/2022 | Tsironis | .................... H03J 1/06 |

OTHER PUBLICATIONS

"Load Pull" [online] Wikipedia, [Retrieved on Aug. 24, 2017]. Retrieved from Internet <URL: https://en.wikipedia.org/wiki/Load_pull>.
"Computer Controlled Microwave Tuner—CCMT", Product Note 41, Focus Microwaves Inc., Jan. 1998.
"On Wafer Load Pull Tuner Setups: A Design Help", Application Note 48, Focus Microwaves, Dec. 2001, p. 2 ff., Figure 2.
"ACP40-GSG-xxx Probes", Brochure PN 153-231-B [online], FormFactor [Retrieved on Apr. 14, 2021]. Retrieved from Internet <URL:https://formfactor.com/download/acp-quick-guide/?/wpdmdl=3524&refresh=60764fb91b8a31618366393)>.

* cited by examiner

*Primary Examiner* — Eman A Alkafawi
*Assistant Examiner* — Suresh K Rajaputra

(57) ABSTRACT

A universal load pull tuner for on wafer load pull and noise measurements is connected directly to the wafer-probe to minimize insertion loss and maximize the tuning range; it incorporates a suspended tuning module and an automated anti-tilting balancing mechanism with manual wafer tip planarization capability, all in a solid housing. The tuning module includes up to three mobile carriages and wideband tuning probes controlling independently impedances for up to three harmonic frequencies. The tuner is mountable under an angle matching the slope of the wafer probes and only requires a simple three axis positioner, without customized accessories, to operate.

9 Claims, 16 Drawing Sheets

PROBE TIP MARKS ON
CHIP (TOP VIEW)

FIG. 12B: Prior art

PROBE TIPS (FRONT VIEW)

PLANARIZING ROTATION
AXIS

GROUND  SIGNAL  GROUND

THETA=0

THETA

BAD PLANARITY

GOOD PLANARITY

SEMICONDUCTOR WAFER

UNIVERSAL TUNER FOR ON WAFER LOAD PULL

PRIORITY CLAIM

Not applicable.

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. "On Wafer Load Pull Tuner Setups: A Design Help", Application Note 48, Focus Microwaves, December 2001, page 2 ff., FIG. 2.
4. "ACP40-GSG-xxx Probes", Brochure PN 153-231-B [online], FormFactor [Retrieved on 2021 Apr. 14]. Retrieved from Internet <URL: https://formfactor.com/download/acp-quick-guide/?/wpdmdl-3524&refresh=60764fb91b8a31618366393)>.
5. Load Pull Characterization, White Paper #64, Focus Microwaves Inc., Chapter 2, pp. 13-15, Chapter 9, pp. 43-49.
6. Tsironis, C. U.S. Pat. No. 10,686,239, "Slide screw tuners with offset tuning probes and method", FIGS. 10, 12.
7. Tsironis, C. U.S. Pat. No. 9,335,345, "A Method for Planarity Alignment of Waveguide Wafer Probes".
8. Tsironis, C. U.S. Pat. No. 9,653,332, "Wafer probe holder for planarity and orientation adjustment", FIGS. 3 and 8.
9. Tsironis, C. U.S. Pat. No. 9,431,999, "Intelligent Mechanical Balancing Apparatus for Slide Screw Tuner".

BACKGROUND OF THE INVENTION

Modern design of low noise and high-power RF amplifiers used in various tele-communication systems, requires accurate knowledge of the active device's (DUT, transistor) characteristics. In such circuits, it is insufficient for the DUT, which operate in their very low noise close to thermal noise, or their highly non-linear regime close to power saturation, to be described using noise or non-linear numeric models only. This invention relates to load and source pull testing (see ref. 1) of low noise and medium or high-power RF transistor and amplifier chips on semiconductor wafers using remotely controlled electro-mechanical impedance tuners (see ref. 2).

A popular method for testing and characterizing high-power microwave and Millimeter-Wave transistors (DUT, device under test) is "load pull" (FIG. 1). Low noise transistors are tested using "source pull". Load or source pull are measurement techniques employing impedance tuners 2, 4 and other test equipment, such as signal or noise sources 1, test fixtures for housing a DUT 3, and power meters or low noise receivers 5 to measure the extracted signal power or the noise figure, the whole being controlled by a computer 6; the computer controls and communicates with the tuners 2, 4 and the other equipment 1, 5 using digital control cables 7, 8, 9. The tuners are used in order to manipulate the microwave impedance conditions in a systematic and controlled manner under which the DUT is tested (see ref. 1); impedance tuners allow determining the optimum impedance conditions for designing amplifiers and other microwave components for specific performance targets, such as noise figure, gain, efficiency, inter-modulation etc., using packaged transistors in test fixtures or chip semiconductor devices on-wafer (see ref. 3).

The insertion loss of the RF links 10, 11 between the tuners and the DUT both when using test fixtures or in on-wafer testing when the DUT are accessed using wafer microprobes, (see ref. 4), reduces dramatically the intrinsic tuning range of the tuners 32 (FIG. 8) to the tuning range of the system 33. This prevents reaching optimum matching conditions 20 or 21 (FIG. 8). To minimize the insertion loss 10, 11, the RF cable (FIG. 9) must be eliminated by connecting the tuner's test port also shown as item 140 (FIG. 14) directly to the wafer microprobe 148. At the level of the probe tips 145, to establish reliable contact with the DUT chip, the wafer microprobe must be aligned and planarized by rotating it together with the attached to it tuner and adjust the misalignment angle THETA (Θ) to zero (FIG. 12A, 12B and ref. 8).

To connect the test equipment with the on-wafer chips one uses cables and RF wafer microprobes (FIG. 9). The microprobes have a support body 31 and a coaxial connector 32 giving RF signal access to the microscopic probe tips 30 (FIG. 3); the, typically, three probe tips must be aligned and oriented exactly parallel (planarized) to the semiconductor wafer (FIG. 12A) to create equal marks 122, 123 on the chip terminal plots 120-121-123. The support body of the microprobes 31 has an inclined rotation axis in line with the probe tips (FIG. 11) and item 35 in FIG. 3, which is not necessarily the same as the rotation axis 34 of the RF connector 32; to planarize the probe tips the whole body of the microprobe and the probe tips must be rotated around this axis 35; if the microprobe is connected to external equipment (tuners), this is only possible if a flexible (and lossy) RF cable is used (FIG. 11 or item 162 in FIG. 16) between the equipment and the coaxial connector of the microprobe or the idle port of the tuning module, in order to absorb the planarization angle change, which can reach up to +/−5 degrees. This flexible cable is also shown in FIG. 15 (item 157).

The electro-mechanical slide screw tuner includes massive mobile carriages (shown schematically in FIG. 5) that move horizontally along the airline (slabline); this means the center of gravity of the system changes, causing a tilting of the tuner. Since the tuner is rigidly connected with the wafer microprobe (FIG. 4), this causes a vertical movement 23 of the probe tips (FIG. 2); to avoid this phenomenon the tuner must be balanced using a mobile counterweight. So far, such balancing mechanism has been external to the tuner (see ref. 9); this means the tuner itself is not universal, i.e., cannot be mounted on any commercial wafer probe station; under circumstances said probe stations must be modified to allow integrating the external counterweight mechanism. This is avoided if the tuner includes the balancing mechanism in its own enclosure, in which case it becomes truly universal mountable on any type of wafer probe station.

BRIEF SUMMARY OF THE INVENTION

The invention consists in incorporating the planarity control mechanism of a wafer microprobe and the tilting compensation (balancing) mechanisms inside a slide screw (load pull) impedance tuner enclosure, which can then be directly mounted on any commercially available 3-axis positioner, directly connected to the RF wafer microprobe without using a flexible cable and adjust the planarity of the three or four fingers making up the tips of the wafer microprobe (FIG. 12B) using a simple arrangement, this way making the tuner truly universal. Prior to the extended slabline tuner technology (see ref. 6), the method used when the tuner test port is far from the wafer probe, employed either a flexible RF cable (FIGS. 9 and 11) and a local rotation mechanism (FIG. 11) or a cumbersome ambitious rotation mechanism rotating the whole tuner body; in the present invention the offset distance between the probe tip plan and the rotation axis of the tuning module inside the tuner enclosure is kept to a minimum (FIG. 3) allowing for a simple, integrated and compact solution towards the fully autonomous load pull tuner.

BRIEF DESCRIPTION OF THE SEVERAL VIEWS OF THE DRAWINGS

The invention and its mode of operation will be more clearly understood from the following detailed description, when read with the appended drawings in which:

FIG. 12A depicts the probe tip marks on the chip connection pads; FIG. 12B depicts a front view of the probe tips and definition of planarity angle THETA.

DETAILED DESCRIPTION OF THE INVENTION

Figure 1:
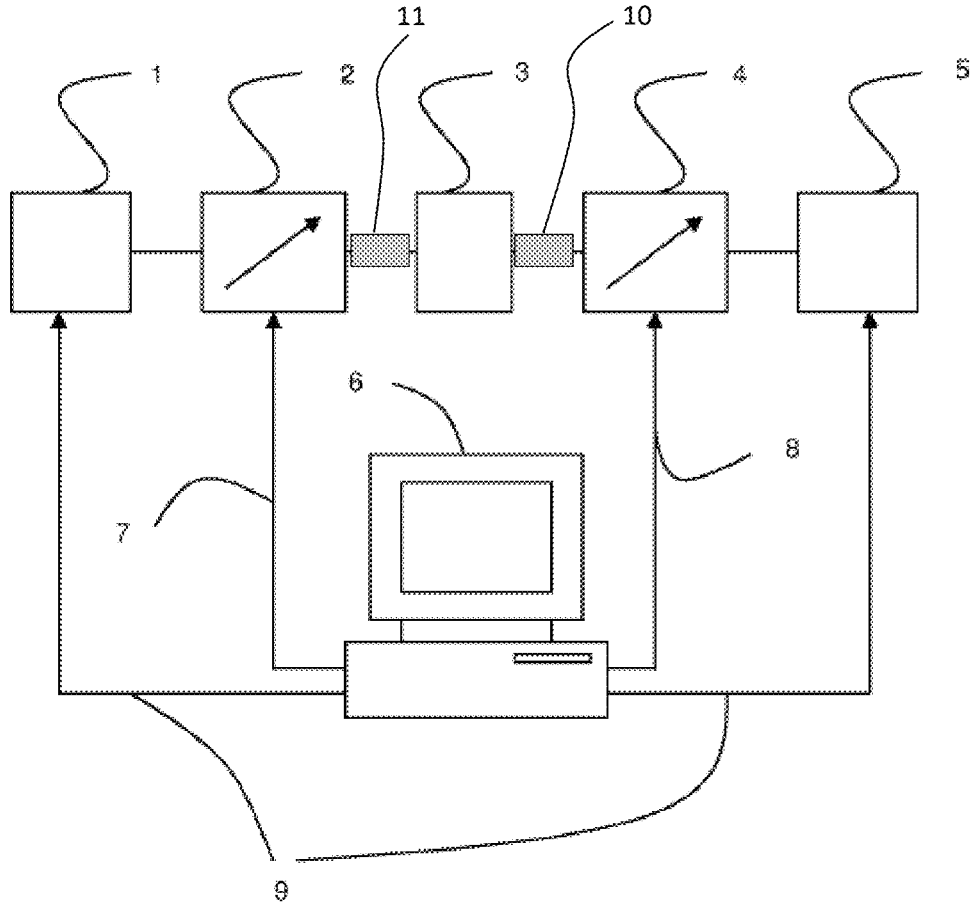
FIG. 1 depicts prior art, a typical automated transistor source and load pull test system.
Figure 2:
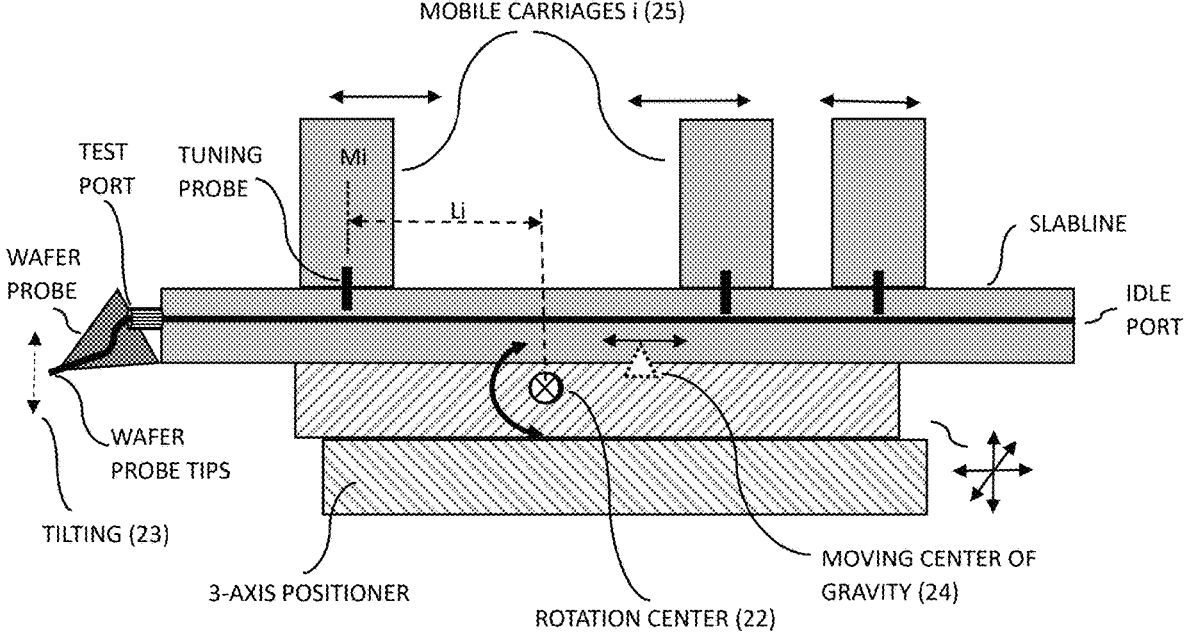
FIG. 2 depicts prior art, movement of center of gravity of a three-carriage slide screw tuner causing tilting and microprobe lifting.
Figure 3:
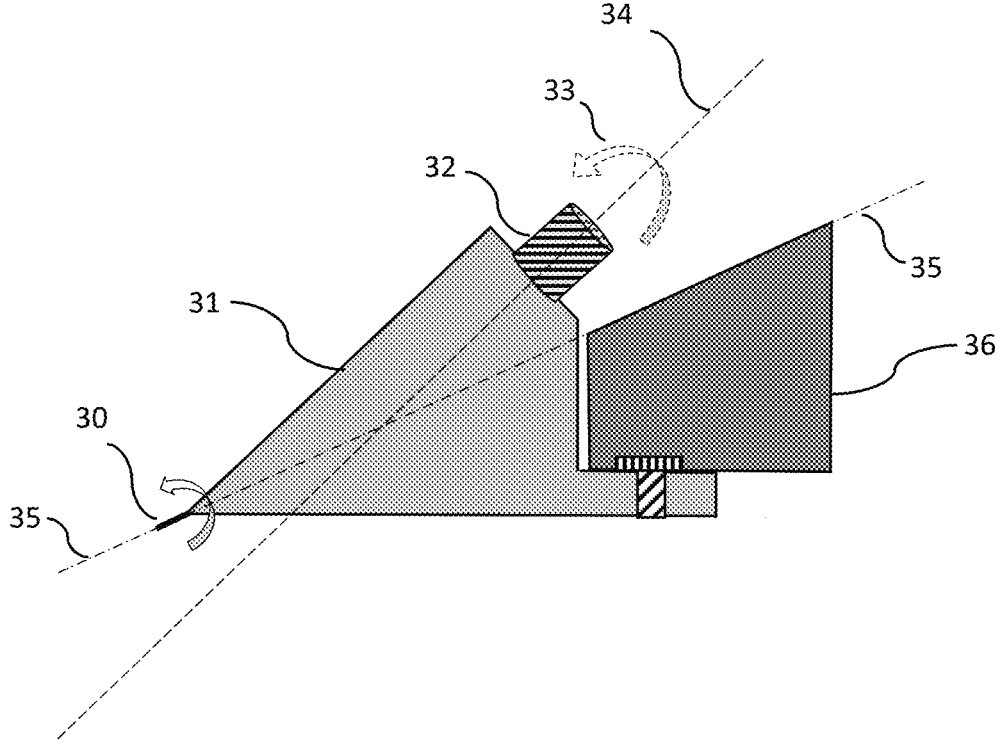
FIG. 3 depicts prior art, schematic view of RF wafer microprobe and its rotation axes through the coaxial connector and the probe tips, showing (exaggerated) that they may not totally overlap.
Figure 10:
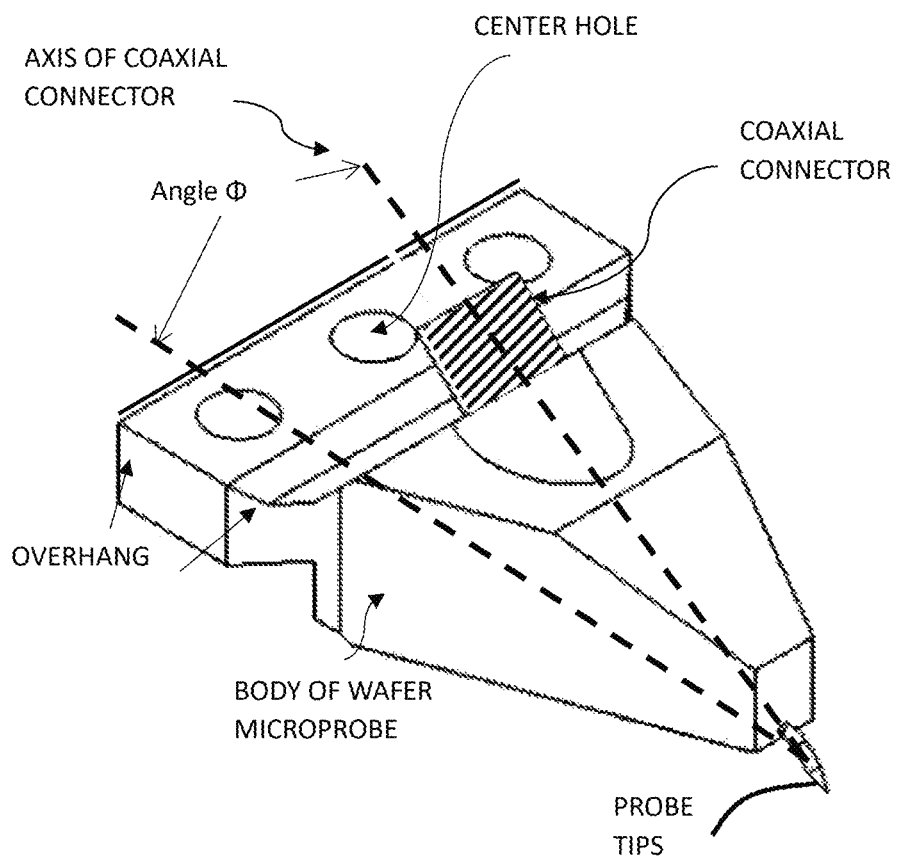
FIG. 10 depicts prior art, definition of the microprobe inclination Φ (typically 30, 45 or 90 degrees). The invention is applicable to microprobes of 30 and 45 degrees.
Figure 11:
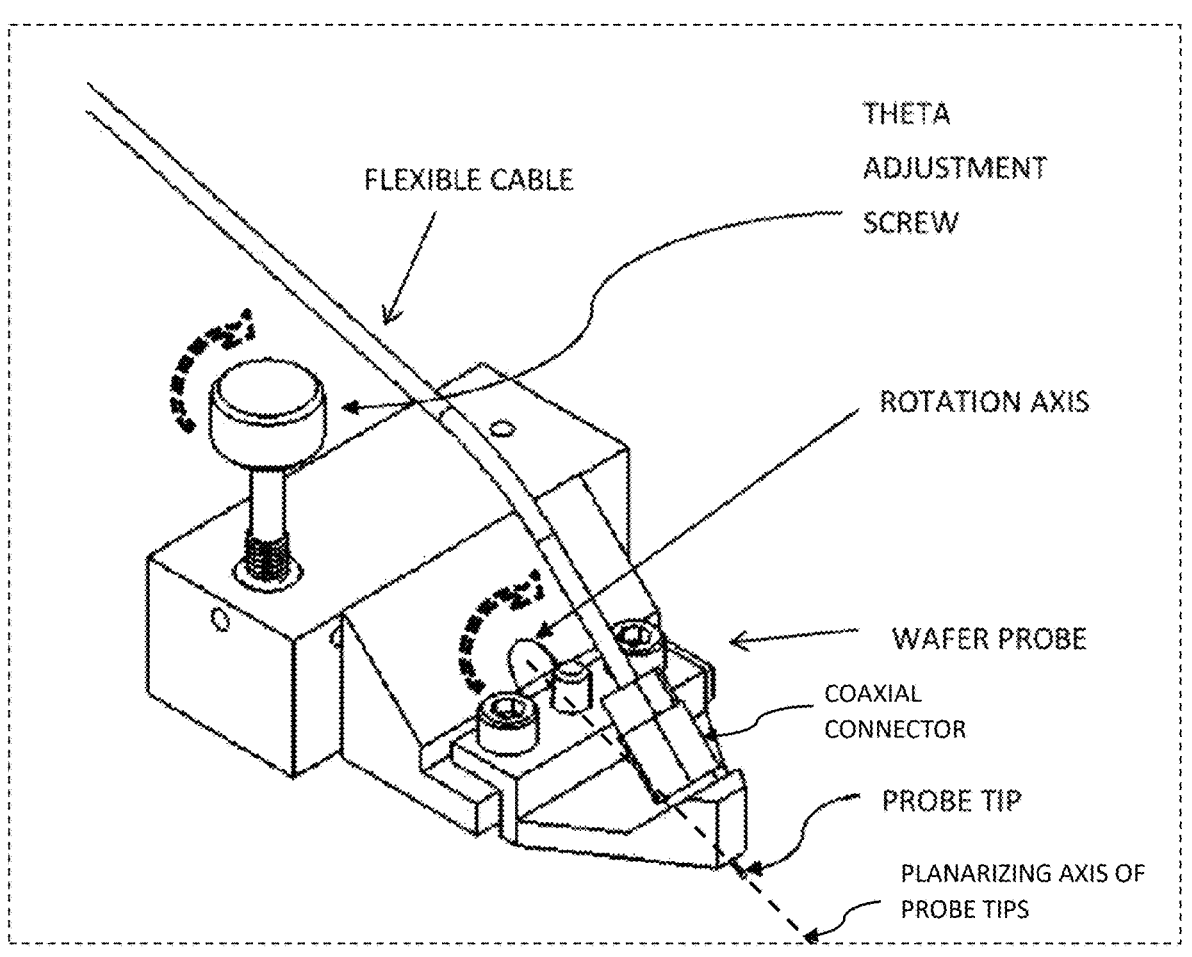
FIG. 11 depicts prior art, a commercially available THETA control mechanism of a microprobe linked with the auxiliary equipment using a lossy flexible or semi-rigid RF cable.

The load pull system (FIG. 1) requires at least one impedance tuner 4 or 2 to be connected to the DUT 3 in order to manipulate the source and/or load impedance. The DUT (typically a chip on a semiconductor wafer) is accessible through wafer microprobes (FIG. 3, 10). The wafer microprobes have a coaxial connector leading directly and with minimum insertion loss, using a short, microscopic (≤1 mm), coplanar waveguide or coaxial cable, to coplanar probe tips (FIG. 12B). The angle Φ (FIG. 10) between the axis of the coaxial connector and the bottom plane of the body of the wafer probe is a characteristic quantity of the probe. There are wafer microprobes with Φ equal 30, 45 or 90 degrees (see ref. 4); this invention deals with 30- and 45-degree probes, to be able to mount the tuners tilted to match the microprobe angle and connect directly to its connector.

Figure 8:
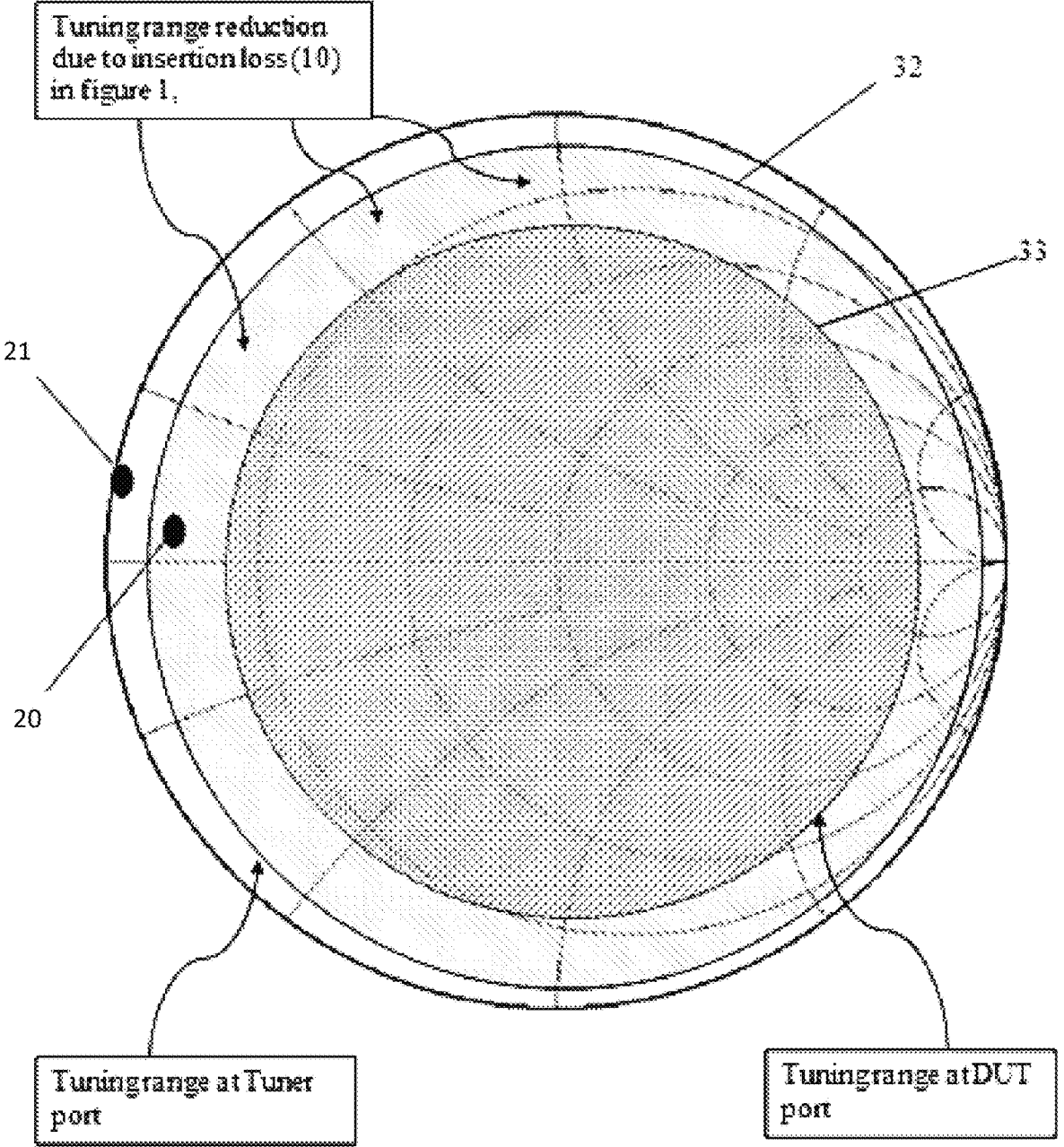
FIG. 8 depicts prior art, the effect of insertion loss between DUT and tuner in reducing the tuning range.
Figure 9:
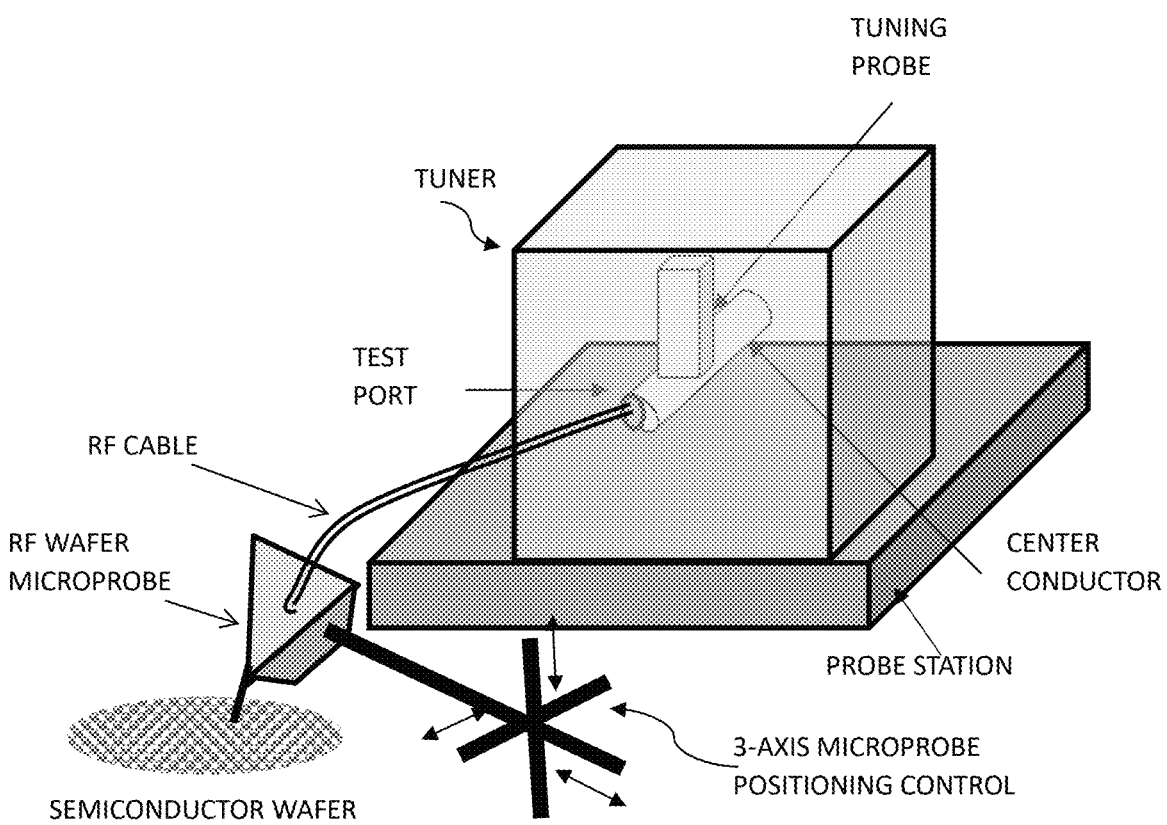
FIG. 9 depicts prior art, on wafer load pull using RF cable to connect the fixed tuner with an adjustable wafer microprobe.

Insertion loss 10, 11 of the connection paths between the tuners 4, 2 and the DUT 3 (FIG. 1) reduce the internal tuning range 32 at the tuner reference plane to the effective tuning range 33 at the DUT reference plane (FIG. 8). The result is that a typical internal impedance 20 of the DUT cannot be physically conjugate matched, except if the insertion loss 10, 11 is minimized and the tuning range 33 is expanded towards the internal tuning range 32. In extreme cases, DUT with internal impedance 21 close to the limit of the Smith chart cannot be matched at all using passive tuners, instead requiring active tuning (see ref. 5). To reach a tuning range close to impedance 20 using a passive tuner, one has to minimize all insertion loss 10, 11 and place the internal tuning probe of the tuner as close to the tuner test port 140 (FIG. 14) as possible (see ref. 6). This is possible if the tuner test port is aligned and directly connected to the wafer microprobe (FIG. 4, 14).

Figure 12:
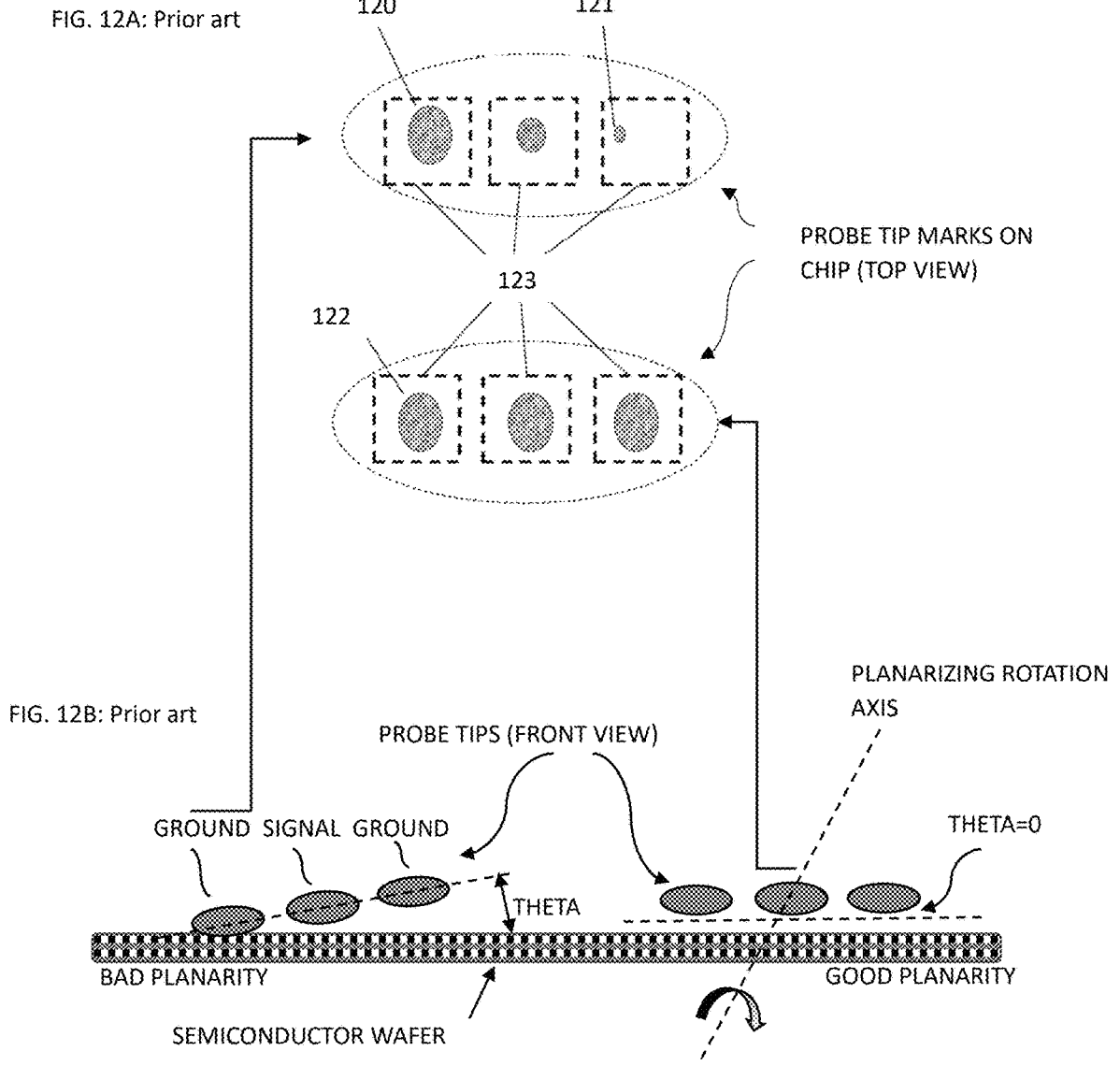
FIGS. 12A through 12B depict prior art, a magnified view of the contact tips of a wafer microprobe as a function of planarity status.
Figure 13:
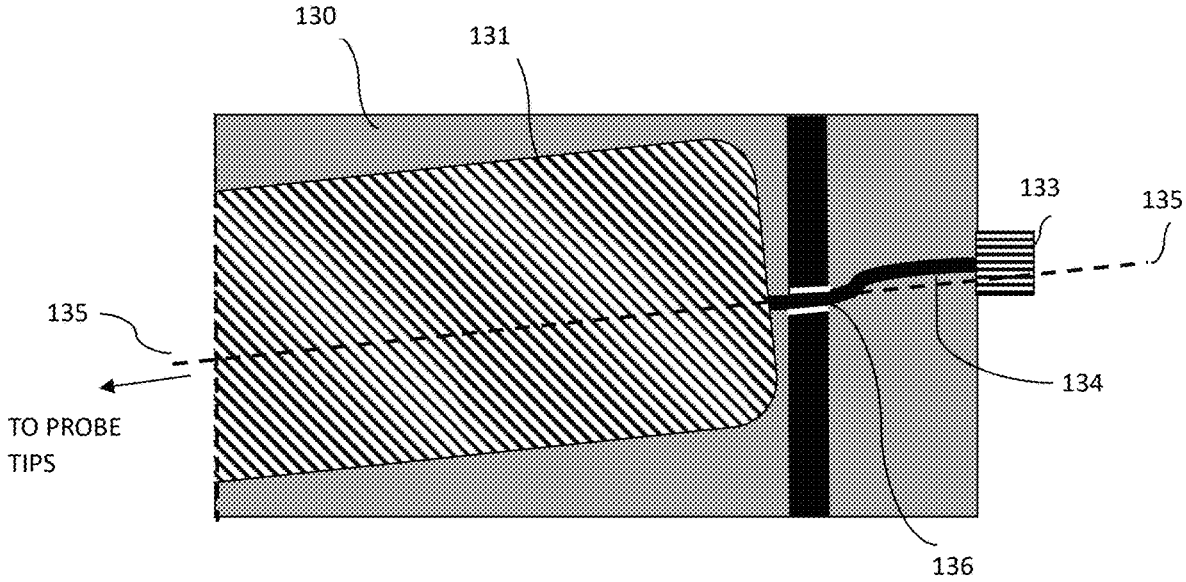
FIG. 13 depicts a detail of connecting the rotating tuning module with the fixed tuner enclosure using a flexible RF cable.

To eliminate the insertion loss between DUT and tuner the RF cable must be removed, i.e., the tuner test port must be directly connected to the microprobe connector. To obtain this in hitherto art (FIG. 12 of ref. 6) the wafer microprobe was connected to the tuner test port by simply screwing and tightening the coaxial connector of the RF microprobe to the tuner test port adapter; however, adjusting the planarization is only possible using some supporting alignment tool (FIGS. 5 and 7 in ref. 7) to planarize the wafer probes (i.e., adjust the angle THETA), as shown in FIGS. 12A and 12B. This planarity adjustment method is obviously based on personal feeling, experience and trial and error, since tightening the coaxial connectors by hand may inadvertently change the final state of the angle THETA (FIG. 12B). The correct approach should be to adjust and fix the planarity of the wafer-probe base after tightening the test port connector.

Figure 14:
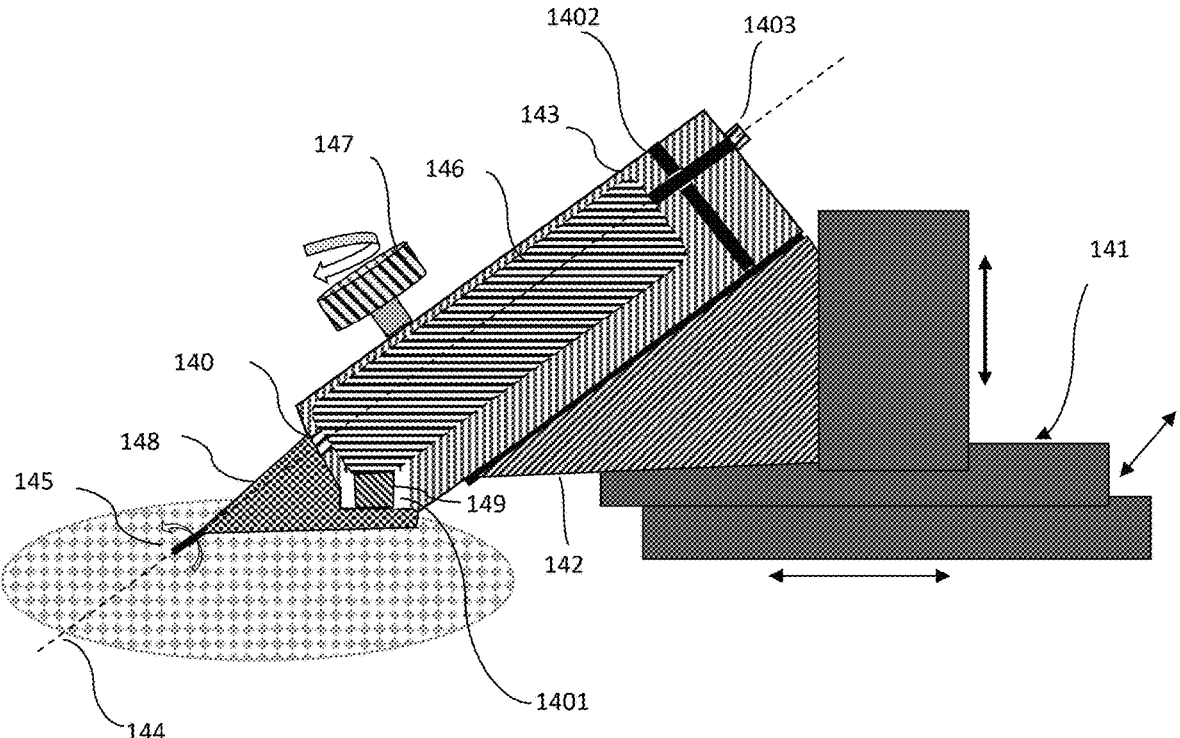
FIG. 14 depicts a planarity control mechanism for an assembly including a low-profile tuner 143 attached to an RF microprobe 148, when the probe tips 145, the probe coaxial connector 140 and the slabline center conductor are aligned on the same axis 144.
Figure 15:
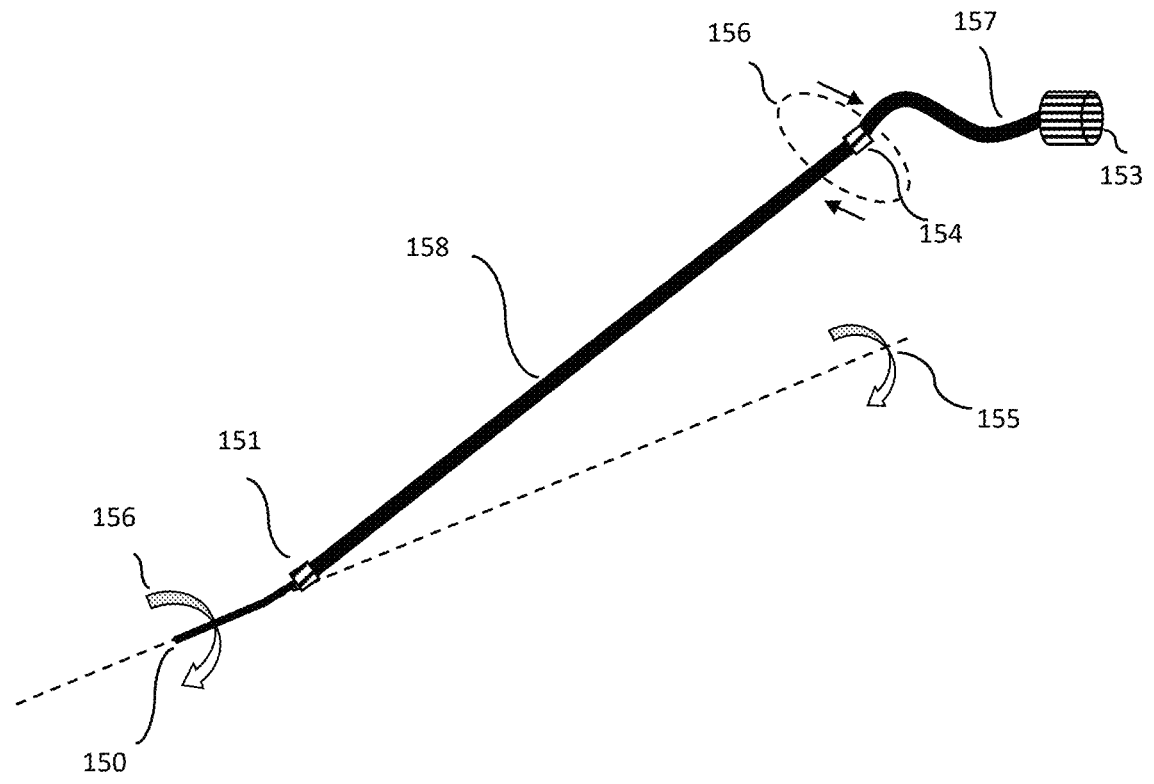
FIG. 15 depicts the geometry of the planetary rotations 155 of the probe tips 150, the coaxial connector 151 of the microprobe and the center conductor 158 directly attached to it tuning module and the output connector 153 of the tuner enclosure.

The mechanically and operationally sound solution of this problem is adjusting the angle THETA after the microprobe connector is securely attached to the tuner body and the test port 406, in which case, however the entire tuner must be rotated around the rotation axis 144 traversing the probe tips (FIGS. 14 and 15). FIG. 14 depicts a favorable situation, where the axis 144 traversing the probe tips is in line with the slabline of the tuning module 146, which includes the slabline and the mobile carriages (item 408 in FIG. 4 or 169 in FIG. 16). In this case it is enough to support the extension of the center conductor of the included slabline using a perpendicular stab 1402 attached to the tuner enclosure and allowing the rotation. The tuner is mounted on the three-axis positioner 141 using a wedge formed support 142 matching the angle of the wafer microprobe. The body of the microprobe 148 is attached to the tuning module 146 using the support block 149 in order to secure a well-defined connection independent of the manual tightening of the connectors 140. The angle of rotation of the tuning module 146 and the attached to it probe 148 and probe-tips 145 is controlled manually by the device (screw 41) and the knob 42, 147 acting against the preloading springs 48. The flexible cable 45 allows rotation between the connectors 43 and 44.

Figure 4:
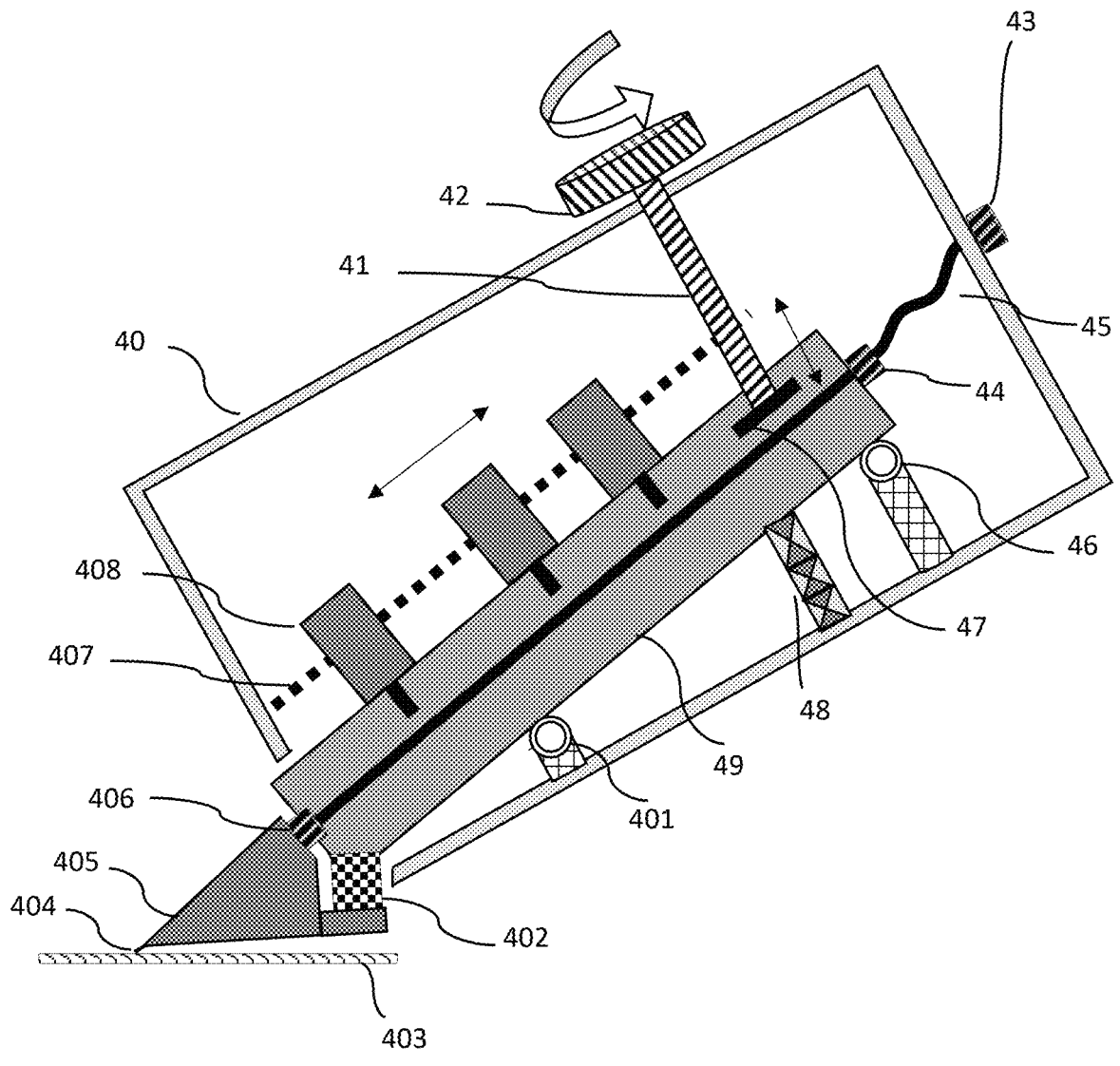
FIG. 4 depicts the autonomous tuner configuration with the tuning module suspended inside the tuner enclosure and the rotation mechanism for probe planarization when the planarity axis of the probe trips are not in line with the RF connector of the microprobe and the center conductor of the slabline (see FIG. 15).

In FIG. 4 a more generic embodiment is shown: the tuning module 49 including the carriages 408, controlled by the ACME rod 407, is mounted inside the tuner enclosure 40 at an angle allowing connecting with the semiconductor wafer 403 and matching the slope of the coaxial test port connector 406 of the wafer microprobe and can rotate inside the enclosure 40 around the planarizing rotation 156 axis 155, and FIGS. 12B, 14 and 15 of the probe tips 150, 404 the slabline and the center conductor 158, using flexible cable 45 between the idle port connector 44 on the tuning module 49 and the idle port connector 43 on the enclosure 40, making the core of the tuning module 49 which protrudes from the tuner enclosure 40 flexible and connected directly with the wafer 403 microprobe via their male versus female coaxial connectors 406. The tuning module (slabline) 49 is linked with the body 405 of the wafer microprobe by the intermediary of the supporting block 402. It is obvious that the tuner enclosure 40 is tilted at a different angle than the tuning module 49; this is because, as shown in FIG. 3, the planarizing rotation axis 35 of the probe tips 30 may be more or less different than the rotation 33 axis 34 of the coaxial connector 32. In this case the support/adapter block 36 must ensure that the planetary rotation per FIG. 15 is feasible. Returning to FIG. 4 such planetary rotation is only possible if a) the tuning module 49 can tilt and rotate inside the tuner enclosure 40, and if its output connector 44 is connected with the tuner output connector using a flexible RF cable 45. The rotation of the tuning module 49 is controlled using a screw 41 with an external knob 42 which works against a spring 48 tilting 47 in the opposite direction. The tilting rotation is possible if tuning module 49 is supported by a set of stabs with a gimble head 401, 46, which are also height adjustable to create the matching angle between the tuning module and the wafer microprobe. In short, the tuning module 49 can tilt forward and rotate sideward inside the tuner enclosure 40 around an axis that may be different than the rotation axis of is slabline.

The implications of an embodiment as in FIG. 3 are shown in FIG. 15: It is obvious that, if the rotation 155 around the planarizing axis through the probe tips 150 does not coincide with the axis of the coaxial connector, then the tuning module 49 (FIG. 4) presented in FIG. 15 by its test port connector 151 (attached directly to the microprobe) and its output connector 154, which is attached to the fixed output tuner enclosure connector 153 must do a complex planetary movement 156 relative to the body of the microprobe, which is only possible if a flexible RF cable 157 is used. The details of this assembly are shown in FG. 13: the planetary rotation movement 135 of the tuning module 131 mounted tilted inside the tuner enclosure 130 conflicts with the axis of the output connector 133 of the tuner 130;

instead, the flexible cable 134, supported rotative at point 136 absorbs this misalignment of the planetary rotation 156 (FIG. 15).

As shown in the embodiment of FIG. 14, here the situation is different: In this case, other than in FIG. 3 or 4, the planarizing rotation axis 144 of the probe tips 145 coincide with the axis of the slabline of the tuning module 146 extended in a straight line towards the output connector 1403. In this case only the extension of the slabline must be supported using a stab 1402 against the tuner enclosure 143 and allow an in-line rotation using the device and knob 147. The tuning module 146 is, again, attached to the body 148 of the wafer connecting microprobe using the support block 149, which traverses the tuner enclosure 143 through an opening 1401 allowing the ±5° planarization correction per FIG. 12B. FIG. 14 also shows the overall mounting of the load pull tuner on a three-axis (X-Y-Z) positioner using a wedge-formed adapter 142 matching the angle Φ of the wafer microprobe (FIG. 10); to be remarked that this angle is not the angle between the planarizing axis 35 and the connector axis 34 (FIG. 3).

Figure 5:
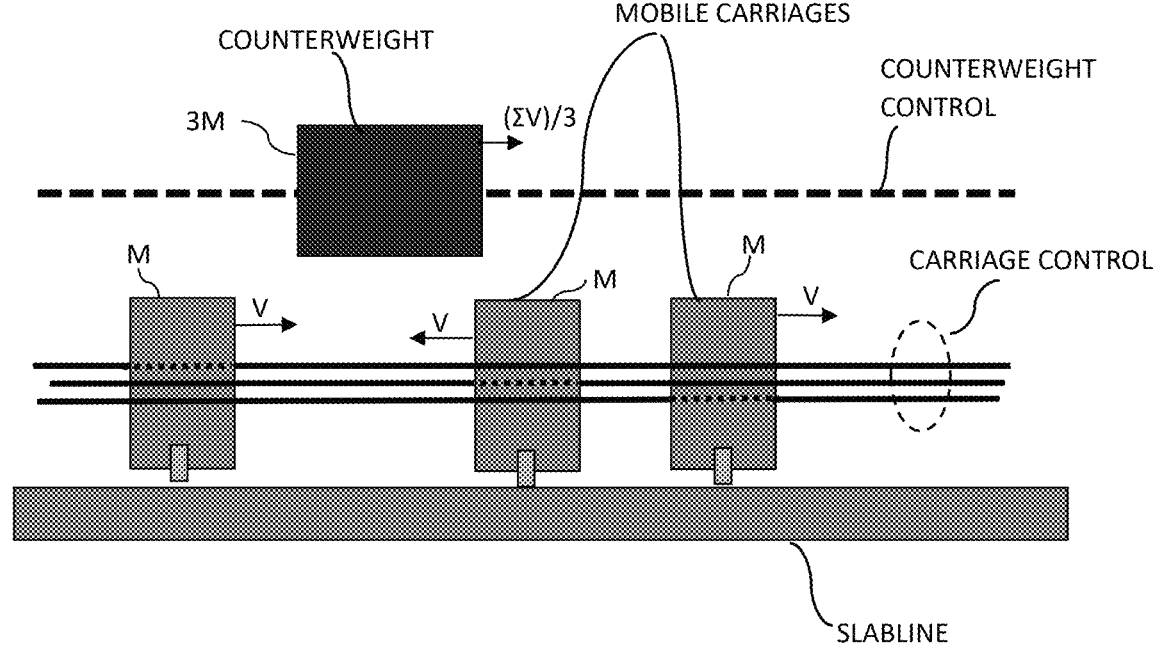
FIG. 5 depicts the balancing mechanism of the tuner tilting using an independently controlled counterweight.

In this disclosure we use two terms to describe the static and dynamic balance of the tuner: the Static Momentum M\*L in [kg\*m] when the masses stand, and the angular Dynamic Momentum (when the masses move): M\*L/t=M\*V(t) in [kg\*m/sec]. The mechanism used to balance the tuner during the movement of the mobile carriages is shown in FIGS. 2, 5-7 and 16; in FIG. 5 are shown schematically the relations in the tuner describing the balancing mechanism: assuming the carriages have equal or quasi equal masses M and moving along a guide (using typically controlling ACME lead screws, or timing belts) at an instantaneous speed V and a counterweight having a mass 3M and moving against the sum Σ of the speed vectors of the carriages in such a way as the vector sum of the angular dynamic momentums ΣM\*V of the carriages be compensated by the counterweight moving in a way to create the opposite angular dynamic momentum, then the movement of the center of gravity of the tuner is balanced; this is better understood in FIG. 2: the center of gravity 24 of the assembly moves as the carriages 25 move creating a small rotation 23 around a center 22; trying to just stabilize the system by making it simply more robust and heavy goes against the laws of physics and can be declared successful only at low tolerance, i.e., acceptable probe tip lifting without endangering the microprobe integrity and/or the continuity and repeatability of the probe contact with the test chip.

Figure 6:
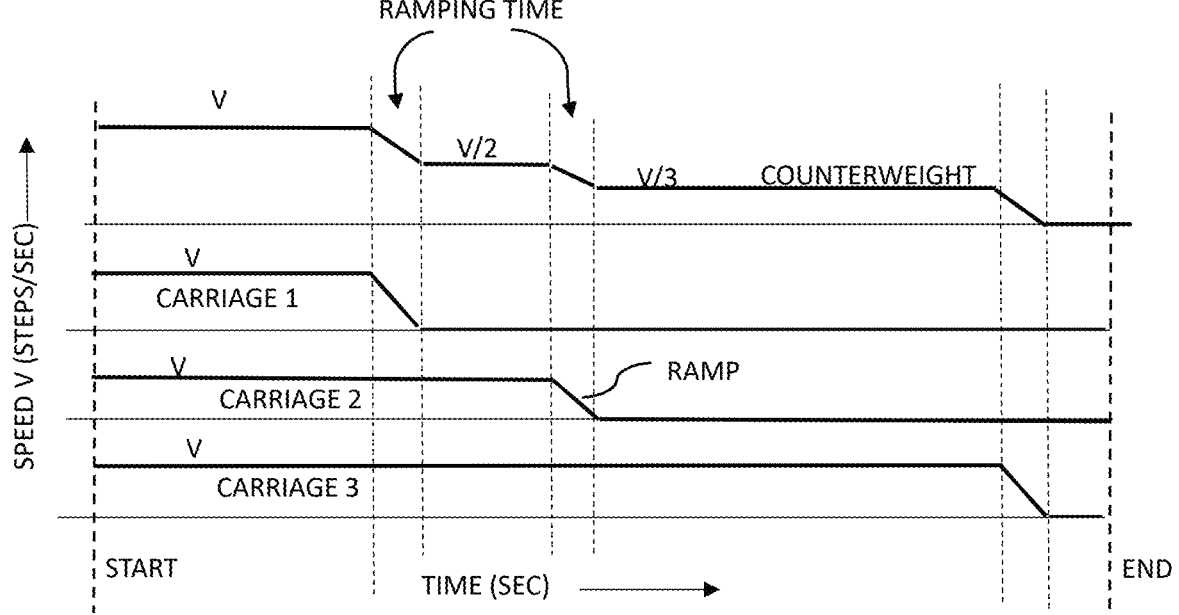
FIG. 6 depicts the instantaneous speed relations for dynamic balancing a three equal-mass equal-speed carriage tuner, in the case some of the carriages decelerate and stop.
Figure 7:
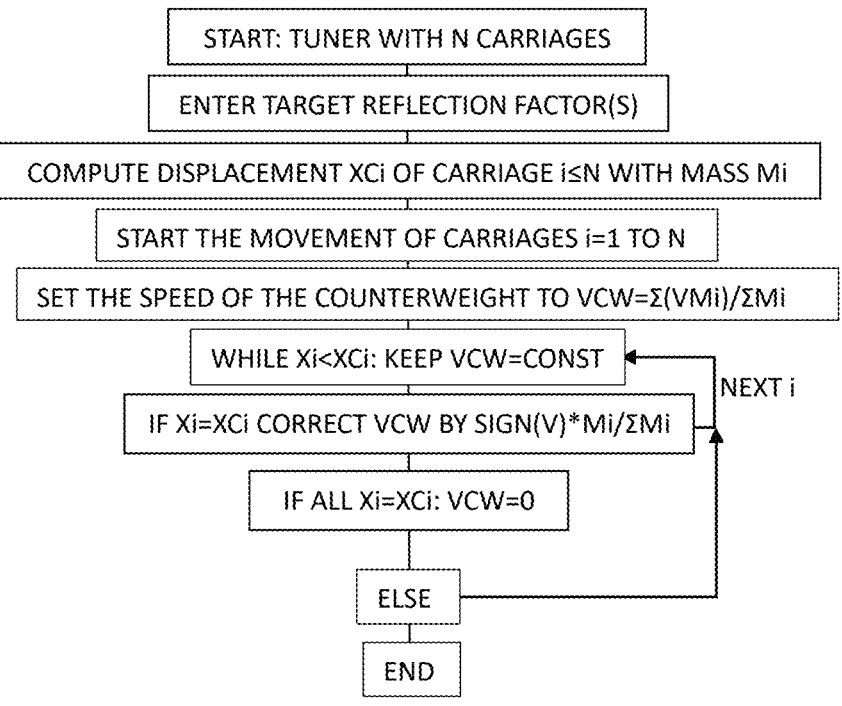
FIG. 7 depicts a flow chart of the generic balancing method to establish steady state balance.
Figure 16:
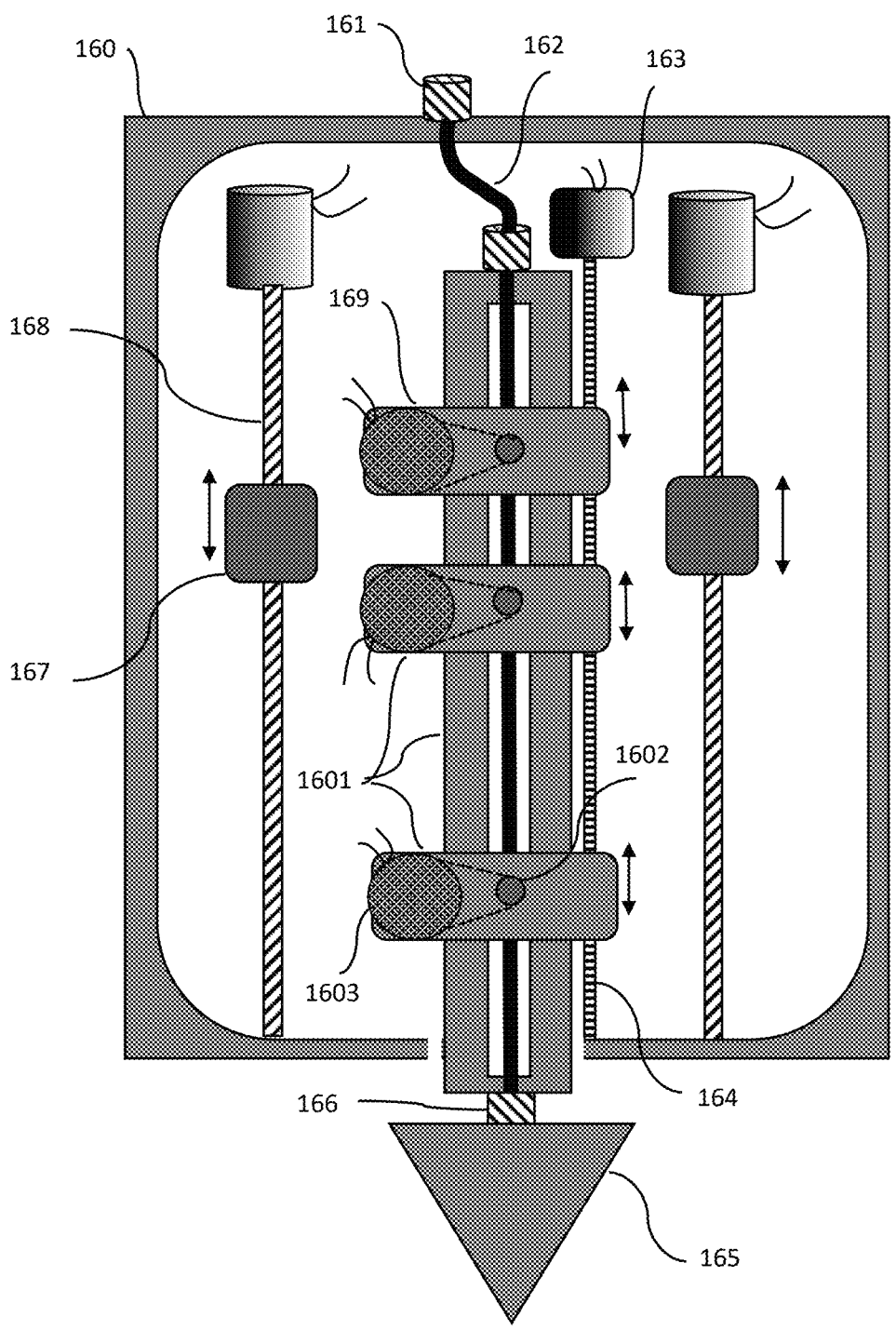
FIG. 16 depicts a top view of an open universal tuner with the moving carriages 169 inside the tuning module and the balancing counterweights 167 for tilting compensation.

There will always be a tilting and the vertical lift 23 of the probe tips which can reach values breaking the probe tips or interrupting the electrical contact; the least that will happen is unreliable electrical contact falsifying the measured data. This must and can be avoided by introducing a dynamic balancing mechanism as shown in FIGS. 5, 6 and 16 using a steady state balancing method of moving carriages as shown in the flowchart of FIG. 7. Equation 1 in ref. 9 states the static balancing condition of non-moving masses: it can be resumed to $\Sigma(L_i*M_i)=0$ eq. {2} where $L_i$ is the distance of a mass $M_i$ from a common rotation center 22; or the sum of all static momentums adds up to zero. However, if the masses start moving, then we have the element of $\Delta L_i$ in a time $\Delta t$, or $\Delta L_i/\Delta t=V_i$, i.e. the instantaneous speed (velocity) at which the masses move; thus, equation {2} becomes $\Sigma(M_i*V_i)=0$, eq. {3}; since the quantity M\*V (mass times velocity) is called here angular dynamic momentum, because it tries to rotate (change the angle of) the system dynamically around an axis, the dynamic balance of the moving masses is obtained when, at each time t of the movement, the angular dynamic momentums Mi*Vi of all moving masses (including carriages and counterweight) add up to zero.

Here, after the horizontal position of the carriage(s) is determined using impedance synthesis (tuning) algorithms, the overall dynamic movement of the counterweight is calculated using the angular dynamically balancing momentum relationship Mcv*Vcv(t)=−ΣMi*Vi(t) eq. {1}, whereby Mcw is the mass of the counterweight, Vcw(t) its instantaneous speed at any instant time "t", Mi are the masses of the carriages "i" (i=1,2,3 . . . ) and Vi(t) their instantaneous speed, leading to the instantaneous speed of the counterweight, from the starting point of the movement until the final steady state.

However, during the movement of the carriages and the counterweight the system may become unbalanced. To avoid this the speed of movement of the counterweight must be instantaneously adapted to the speed of movement of the center of gravity of the tuner; this is possible using the angular dynamic momentums (M*V) of all masses M moving at instantaneous speeds V: The relation Mcw*Vcw(t)=−ΣMi*Vi(t) eq. {1} means that, if one carriage stops moving, Vi(t)=0, because it has reached its destination, the counterweight must move at slower speed etc. There is also the issue of accelerating-decelerating the carriages (this speed ramping is adopted to avoid movement shocks); in this case the eq. {1} must always be satisfied, i.e., the speed-up or slow-down (ramping) times must always be the same. This makes the control of the carriages and the counterweight more complicated and requires fine micro-stepping of the controlling stepper motors. All this is shown graphically in FIG. 6 for a typical example of a harmonic tuner using three carriages: when all carriages move the counterweight moves, per {eq.1}, at full speed; when one carriage slows down to stop, so does the counterweight, reducing its speed by one third (or, more accurately by a factor Mi/ΣMi); the slowing ramp time is the same for the single carriage and for the counterweight. Subsequently if a second carriage slows down and stops, so does the counterweight from two-thirds to one third of its speed respecting the ramping time. The same is, obviously, valid when switching from two to one moving carriage 25. The balancing procedure of the flowchart of FIG. 7 ensures that the location of the rotation center 22 of the overall system (tuner plus positioner), shown in FIG. 2, does not be known precisely, since overall static balancing is performed measuring and minimizing the lifting 23 of the probe tips by keeping the horizontal distance between the moving center of gravity 24 and the fixed rotation center 22 constant.

Equation {1} is generalized and includes non-equal masses and non-equal speeds at which the masses move (FIG. 5). However, the invention focuses, without losing general validity, on the specific case of an electro-mechanical tuner, including three mobile carriages having similar or physically equal mass M and moving all at the same speed V (see ref. 9); in that case, as discussed above, balancing the system requires three distinct moving speeds of the counterweight having a mass 3M: V, V/2, and V/3 (FIG. 6).

In case of the acceleration-deceleration phase: in order to avoid sudden shocks and sudden tilting of the system, the stepper motors controlling the gear moving the carriages and the counterweight are ramped up from standing to their normal rotating speed and back, which, in view of the specified required torque and possible self-resonance of the motor coils is, typically and conservatively, 200 steps/sec at 1.8°/step or 1 rotation i.e., 360°/sec. This rotation is translated, via the appropriate gear (belt, pulley, ACME screw . . . ) to horizontal (and vertical) move (i.e., ΔX/step) of the mobile carriage and the tuning probe. The concern here is only horizontal movement of the mobile carriages, because this affects the position of the center of gravity of the system, since the vertically moving tuning probe has a mass a small fraction (<0.5%) of the mass of a mobile carriage (<5 g versus 1 kg). During the ramping up or down, since the starting speed is =0, care is taken the ramping to always last the same time.

In all cases, as shown in FIGS. 5 and 6, it is only the horizontal component of the movement speed either of the carriages or of the counterweight that matter in calculating the balancing conditions. This is, also, why the vertical movement of the tuning probes is irrelevant in the balancing process: in case the tuner is mounted flat and not sloped, the horizontal speed component of the vertically moving tuning probe is zero, and, if the tuner is mounted sloped, the short vertical movement of the tuning probe and its small mass renders its contribution negligeable as well.

The overall top view of the balanced universal tuner is shown in FIG. 16: the tuning module including slabline, mobile carriages and associated control gear 1601, 163 and 164 is suspended inside the tuner housing 160. It has a test port connector 166 connected directly to the wafer probe 165 and an idle port connected with the idle port of the tuner 161 using the flexible cable 162; the carriages are moved using stepper motors 163 and gear 164; the counterweights 167 are moved using ACME gear 168. The vertical axes for the (not shown) tuning probes are controlled using belts, pulleys 1602 and vertical stepper motors 1603.

Obvious alternative embodiments to the herein disclosed integrated solution, incorporated in slide-screw load pull tuners directly connected to wafer microprobes, have been reported before separately, but none renders the tuner fully and rigorously autonomous, i.e., integrable without alterations or add-on external components on any available commercial wafer probe station and cannot impede on the validity of the basic idea.

What is claimed is:

1. A load pull tuner for on-wafer measurements allowing a shortest connection to external wafer probes, a balanced and tilting-free operation, and a planarity adjustment of the external wafer probes, comprising: a housing (enclosure) containing a tuning module movable inside the housing, a balancing mechanism for the tuning module and a planarization mechanism for the external wafer probes performed by the tuning module, which is attached and directly RF connected to the external wafer probes;

wherein
   the external wafer probes have a body, a coaxial
      connector protruding from the body at an angle and
      probe tips with a planarizing rotation axis;
and wherein
   the tuning module has a test and an idle port linked
      through a slabline and both equipped with coaxial
      connectors and linked through a slabline, it and
      includes at least one mobile carriage remotely mov-
      able along the slabline and controlling a tuning probe
      insertable into the slabline and wherein the tuning
      module can be inclined on a vertical plane to match
      the angle of the coaxial connector of the external
      wafer probe and can be rotated around the planar-
      ization rotation axis of the probe tips;
and wherein
   the balancing mechanism for the tuning module com-
      prises at least one remotely controlled counterweight movable at controlled speed opposite to a movement of the center of gravity of the tuning module, which is caused by the movement of the at least one mobile carriage;

and wherein the planarization mechanism of the external wafer probes comprises rotating the tuning module around the planarizing rotation axis of the probe tips of the external wafer probe of which the coaxial connector is directly connected to the coaxial connector of the test port of the tuning module.

2. The load pull tuner of claim 1 being mounted on a wafer probe station using a three-axis (X-Y-Z) positioner; wherein the load pull tuner is mounted on the three-axis positioner at an angle on a vertical plane allowing alignment and direct connection of the coaxial connector of the test port of the tuning module with the coaxial connector of the external wafer microprobe.

3. The balancing mechanism of the tuning module of the load pull tuner of claim 1, wherein the at least one counterweight with a mass M.CW is movable at a horizontal instantaneous speed V.CW whereby creating an angular dynamic momentum (M.CW*V.CW) which is equal and opposite to the vectorial sum of the angular dynamic momentums (Mi*Vi) of the mobile carriages (i=1, 2, . . . ) with associated mass Mi moving at associated instantaneous horizontal speed Vi.

4. The balancing mechanism of tuning module of the load pull tuner of claim 2, wherein the tuning module comprises three (3) mobile carriages each having a mass M and movable at an instantaneous horizontal speed V, and wherein the counterweight has a mass of 3M and moves at opposite horizontal instantaneous speed adjustable between V, when all carriages move, V/2, when two carriages move, and V/3, when one carriage moves.

5. The balancing mechanism of the tuning module of the load pull tuner of claim 3, wherein all carriages and the counterweight use an identical ramping up and ramping down time between instantaneous speed states.

6. The planarization mechanism for wafer microprobes of the load pull tuner of claim 1 allowing the tuning module, of which the test port connector is directly attached to the connector of the external wafer microprobe, to be aligned with and rotated around the planarizing rotation axis of the probe tips.

7. The planarization mechanism of the external wafer probes of claim 1 for controlling the rotation of the tuning module inside the tuner enclosure by an angle of at least ±5 degrees around the planarizing rotation axis of the probe tips comprising:

a set of adjustable gimble support devices between the tuning module and the tuner housing, a spring-loaded anchoring arrangement of the tuning module to the tuner housing, and a manually adjustable device controlling the angle.

8. A device for attaching the body of the external wafer microprobe to the tuning module of the load pull tuner of claim 1 comprising an interface support block allowing the tuning module to rotate around the planarizing axis of the probe tips.

9. The interface support block of claim 8 being attached to the body of the external wafer microprobe and to the tuning module.

* * * * *